(12) United States Patent
Hou et al.

(10) Patent No.: US 10,566,397 B2
(45) Date of Patent: Feb. 18, 2020

(54) INK JET PRINTING FIRST AND SECOND MATERIALS TO FORM A PIXEL DEFINING LAYER HAVING GROOVE

(71) Applicant: BOE Technology Group Co., Ltd., Beijing (CN)

(72) Inventors: Wenjun Hou, Beijing (CN); Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/094,337

(22) PCT Filed: Jan. 10, 2018

(86) PCT No.: PCT/CN2018/072125
§ 371 (c)(1),
(2) Date: Oct. 17, 2018

(87) PCT Pub. No.: WO2018/205672
PCT Pub. Date: Nov. 15, 2018

(65) Prior Publication Data
US 2019/0229161 A1    Jul. 25, 2019

(30) Foreign Application Priority Data
May 12, 2017  (CN) .......................... 2017 1 0335741

(51) Int. Cl.
*H01L 21/00* (2006.01)
*H01L 29/08* (2006.01)
(Continued)

(52) U.S. Cl.
CPC ...... *H01L 27/3246* (2013.01); *H01L 27/1292* (2013.01); *H01L 27/3283* (2013.01);
(Continued)

(58) Field of Classification Search
CPC . H01L 27/3246; H01L 51/0005; H01L 51/56; H01L 51/0007; H01L 27/1292
See application file for complete search history.

(56) References Cited

U.S. PATENT DOCUMENTS 7,928,653 B2    4/2011  Oh
9,929,342 B2*   3/2018  Dai ..................... H01L 51/0005
(Continued)

FOREIGN PATENT DOCUMENTS

CN    103367391 A    10/2013
CN    104425549 A    3/2015
(Continued)

OTHER PUBLICATIONS

English translations of International Search Report and Box V of the Written Opinion for International Application No. PCT/CN2018/072125, dated Apr. 18, 2018, 5 pages total (Chinese versions submitted with application).

*Primary Examiner* — Alonzo Chambliss
(74) *Attorney, Agent, or Firm* — Westman, Champlin & Koehler, P.A.

(57) ABSTRACT

Preparation methods for a pixel defining layer and an OLED, a pixel defining element, an OLED, and a display device are disclosed. The method for preparing a pixel defining layer comprises: providing a substrate; forming a first defining pattern on the substrate, wherein the first defining pattern is composed of a concave accommodation groove, and the concave accommodation groove is formed by ink jet printing a first material, forming a first defining pattern layer in a predetermined region of the substrate, and then subjecting the first defining pattern layer to a drying treatment; forming a second defining pattern by ink jet printing a second material in the concave accommodation groove, wherein the
(Continued)

first defining pattern and the second defining pattern constitute the pixel defining layer.

20 Claims, 3 Drawing Sheets

(51) Int. Cl.

| | | |
|---|---|---|
| H01L 31/0232 | (2014.01) | |
| H01L 27/32 | (2006.01) | |
| H01L 51/56 | (2006.01) | |
| H01L 51/00 | (2006.01) | |
| H01L 27/12 | (2006.01) | |

(52) U.S. Cl.
CPC ...... *H01L 51/0005* (2013.01); *H01L 51/0007* (2013.01); *H01L 51/56* (2013.01); *H01L 2227/323* (2013.01)

(56) References Cited

U.S. PATENT DOCUMENTS

| | | | |
|---|---|---|---|
| 10,263,055 B2* | 4/2019 | Wang | H01L 51/5256 |
| 2010/0052524 A1* | 3/2010 | Kinoshita | H01L 27/3213 |
| | | | 313/504 |
| 2015/0060810 A1* | 3/2015 | Han | H01L 27/3246 |
| | | | 257/40 |
| 2015/0333110 A1 | 11/2015 | Park et al. | |
| 2016/0329530 A1 | 11/2016 | Park et al. | |
| 2017/0110532 A1* | 4/2017 | Kim | H01L 51/0017 |
| 2018/0233694 A1* | 8/2018 | Ajiki | H01L 27/3279 |

FOREIGN PATENT DOCUMENTS

| | | |
|---|---|---|
| CN | 105070651 A | 11/2015 |
| CN | 107146807 A | 9/2017 |

* cited by examiner

INK JET PRINTING FIRST AND SECOND MATERIALS TO FORM A PIXEL DEFINING LAYER HAVING GROOVE

CROSS-REFERENCE TO RELATED APPLICATION

The present application is a Section 371 National Stage application of International Application. No. PCT/CN2018/072175, filed on 10 Jan. 2018, which has not yet published, and claims priority to Chinese Patent Application No. 201710335741.9, filed on May 12, 2017, the contents of which are incorporated herein by reference in their entirety.

TECHNICAL FIELD

The present disclosure relates to the electronic field, and particularly to a preparation method for a pixel defining layer, a preparation method for an organic light emitting device (OLED), a pixel defining element, an OLED, and a display device.

BACKGROUND

With development of science and technology, OLEDs have been widely used. As compared with liquid crystal displays (LCDs), OLEDs have advantages of self-light emitting, rapid response, wide viewing angle, high luminance, bright colors, light weight and thin thickness, and the like, and are regarded as a next generation display technology. Nowadays, OLEDs tend to be large scale and large size.

Current methods for preparing an OLED light emitting layer mainly include two kinds of processes, i.e., a vacuum evaporation process and a solution process. As compared with the vacuum evaporation process, the solution process has advantages of low equipment cost, high material utilization ratio, high precision for large-size product mask alignment, and the like. Commonly used solution process includes a spin coating process, an ink jet printing process, a nozzle coating process, and the like. With development of ink jet printing technology, the printing position of a material to be printed (e.g. an organic material constituting a light emitting layer) can be precisely controlled at present.

However, current pixel defining layers, preparation methods thereof and OLEDs still need to be improved.

SUMMARY

The present disclosure is based on the discovery and knowledge of the following facts and problems.

The inventors find that current OLED organic thin films formed by using ink jet printing technology generally suffer problems such as non-uniform thickness of the organic thin film, complex preparation process for forming a pixel defining layer required for the ink jet printing, and the like. After intensive studies and a great number of experiments, the inventors have found out that, although a printing position can be precisely controlled in the ink jet printing technology under a positioning action of a pixel defining layer, the thickness of the thin film formed by printing cannot be precisely controlled. Mainly due to this reason, the thickness of the organic thin film is not uniform. To solve such a problem, a solution using a pixel defining layer with a particular structure to define the thickness of thin film formed by ink jet printing is proposed. However, the preparation of this kind of pixel defining layer requires a complex treating process (for example, use of a double masking process and a double exposure process in the preparation), such complex preparation process of the pixel defining layer results in a long overall production cycle of ink jet printing and a high cost.

The present disclosure is intended to alleviate or solve at least one of the above-mentioned problems at least to a certain extent.

In an aspect, the present disclosure provides a method for preparing a pixel defining layer, comprising: providing a substrate; forming a first defining pattern on the substrate, said forming the first defining pattern comprising ink jet printing a first material on the substrate, and then forming a concave accommodation groove, the concave accommodation groove constituting the first defining pattern; forming a second defining pattern by ink jet printing a second material in the concave accommodation groove, wherein the first defining pattern and the second defining pattern constitute the pixel defining layer.

According to an embodiment of the present disclosure, the concave accommodation groove is formed by ink jet printing the first material to form the first defining pattern layer in a predetermined region of the substrate, and then subjecting the first defining pattern layer to a drying treatment.

According to an embodiment of the present disclosure, the first defining pattern has a first surface energy, and the second defining pattern has a second surface energy, wherein the first surface energy is higher than the second surface energy.

According to an embodiment of the present disclosure, before forming the first defining pattern, the method further comprises: subjecting a surface of the substrate for forming the first defining pattern and the second defining pattern to a modification treatment, to reduce the surface energy of the substrate.

According to an embodiment of the present disclosure, the first material comprises at least one of a polyimide and an acrylic material.

According to an embodiment of the present disclosure, said ink jet printing the first material comprises: dissolving the first material in a first solvent to prepare a first solution and ink jet printing the first solution, wherein the first material has a concentration of 0.5 wt % to 30 wt % in the first solvent; and the first solvent has a boiling point not higher than 180° C.

According to an embodiment of the present disclosure, the drying treatment includes a vacuum drying treatment under reduced pressure, a normal temperature drying treatment, or a low temperature drying treatment.

According to an embodiment of the present disclosure, the vacuum drying under reduced pressure comprises: subjecting the first defining pattern layer to a vacuum drying treatment under reduced pressure, by reducing the pressure of a cavity for performing the vacuum drying treatment under reduced pressure to 150 to 250 Pa over 3 to 10 minutes, keeping the reduced pressure for 5 to 15 minutes, and subjecting the first defining pattern layer after vacuum drying treatment under reduced pressure to a baking treatment at a temperature not lower than 200° C.; the normal temperature drying comprises: allowing the first defining pattern layer stand at a normal temperature for 25 to 50 minutes; and the low temperature drying comprises: allowing the first defining pattern layer stand at a temperature not higher than 20° C. for 40 to 60 minutes.

According to an embodiment of the present disclosure, the second defining pattern is formed by ink jet printing a solution containing the second material in the concave accommodation groove, and performing a baking treatment.

According to an embodiment of the present disclosure, the second material comprises at least one of a fluorinated polyimide, a polysiloxane and a fluorinated methyl methacrylate, and the baking treatment is performed at a temperature not lower than 200° C. and not higher than 250° C.

In another aspect, the present disclosure provides a method for preparing an OLED. The method comprises: a step of preparing a pixel defining layer, and a step of forming an organic layer in the pixel defining layer, wherein said step of preparing the pixel defining layer is performed by using the preparation method as described above.

In yet another aspect, the present disclosure provides a pixel defining element. According to an embodiment of the present disclosure, the pixel defining element comprises: a substrate, and a pixel defining layer formed on the substrate, wherein the pixel defining layer comprises a first defining pattern and a second defining pattern, the first defining pattern is composed of a concave accommodation groove formed from a first material, and the second defining pattern is formed from a second material in the concave accommodation groove.

According to an embodiment of the present disclosure, the first defining pattern has a first surface energy, and the second defining pattern has a second surface energy, wherein the first surface energy is higher than the second surface energy.

According to an embodiment of the present disclosure, the first material comprises at least one of a polyimide, and an acrylic material; and the second material comprises at least one of a fluorinated polyimide, a polysiloxane and a fluorinated methyl methacrylate.

According to an embodiment of the present disclosure, the substrate has a third surface energy, wherein the third surface energy is less than the first surface energy and less than the second surface energy.

According to an embodiment of the present disclosure, the second defining pattern is a protrusion formed in the concave accommodation groove, wherein a difference in height between a top of the second defining pattern and the concave accommodation groove is not less than 0.5 μm.

According to an embodiment of the present disclosure, an upper surface of the second defining pattern is arc-shaped, hemispheric, trapezoidal, or parabolic.

According to an embodiment of the present disclosure, a width of the second defining pattern in a direction parallel to the substrate is not more than that of the first defining pattern.

According to an embodiment of the present disclosure, the pixel defining layer has a height of 1 to 3 μm, and a width of 15 to 100 μm, wherein the concave accommodation groove has a height of 1 to 3 μm, and a width of 15 to 100 μm.

In yet another aspect, the present disclosure provides an OLED. The OLED comprises: the above described pixel defining element, and a light emitting layer formed in a pixel region defined by the pixel defining layer.

In yet another aspect, the present disclosure provides a display device. The display device comprises the above described OLED.

BRIEF DESCRIPTION OF DRAWINGS

The above and/or additional aspects and advantages of the present disclosure will become apparent and easily understood from the description of the embodiments with reference to the drawings, in which.

DETAILED DESCRIPTION

Figure 1:
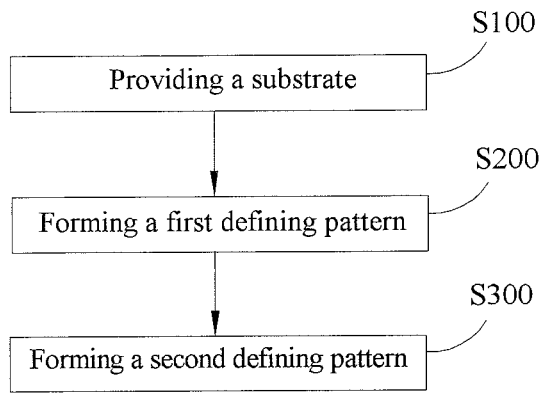
FIG. 1 shows a schematic flow chart of a method for preparing a pixel defining layer according to an embodiment of the present disclosure.

The embodiments of the present disclosure will be described in detail below. The examples of the embodiments are shown in the drawings, throughout which identical or similar reference numbers indicate identical or similar elements or elements having identical or similar functions.

The embodiments described below with reference to the drawings are exemplary, and are only intended to illustrate the present disclosure, but cannot be understood to limit the present disclosure.

In an aspect, the present disclosure provides a method for preparing a pixel defining layer. According to the embodiments of the present disclosure, with reference to FIG. 1, the method comprises the following steps.

S100: Providing a Substrate

According to the embodiments of the present disclosure, in this step, a substrate for forming the pixel defining layer is provided.

According to the embodiments of the present disclosure, the type of the substrate is not particularly limited, as long as the substrate can provide supporting to the pixel defining layer. For example, according to a particular embodiment of the present disclosure, when an OLED is prepared by ink jet printing, the substrate for ink jet printing the pixel defining layer may be used as the substrate of the OLED. For example, the substrate may be glass.

S200: Forming a First Defining Pattern

According to the embodiments of the present disclosure, the first defining pattern is formed on the substrate, wherein the first defining pattern is composed of a concave accommodation groove. The concave accommodation groove may be formed by ink jet printing a first material to form a first defining pattern layer in a predetermined region of the substrate, and then subjecting the first defining pattern layer to a drying treatment. According to the embodiments of the present disclosure, the first material may have a relatively high surface energy, such that it is advantageous in the formation of the first defining pattern by making better use of the coffee ring effect in subsequent drying treatment.

S300: Forming a Second Defining Pattern

According to the embodiments of the present disclosure, the second defining pattern is formed in the first defining pattern. The first defining pattern and the second defining pattern constitute the pixel defining layer.

According to the embodiments of the present disclosure, the second defining pattern is formed in the concave accommodation groove of the first defining pattern, wherein the second defining pattern is formed by ink jet printing a second material.

According to the embodiments of the present disclosure, the method for preparing a pixel defining layer has at least one of the following advantages. The preparation of a pixel defining layer capable of precisely controlling the printing thickness can be achieved without the double masking process. Thus, the preparation process of the pixel defining layer for ink jet printing can be simplified, the production cost can be reduced, and the accuracy for alignment can be improved.

Figure 2:
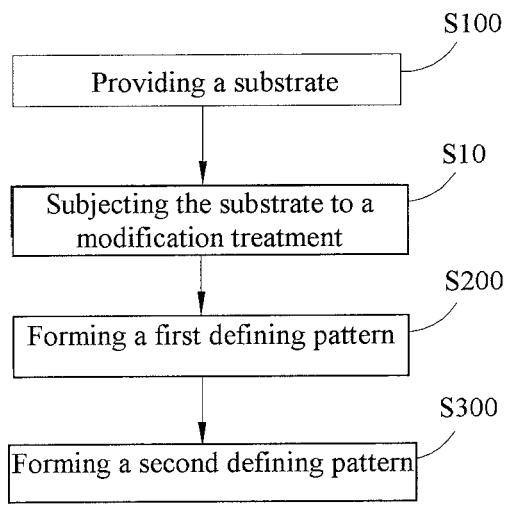
FIG. 2 shows a schematic flow chart of a method for preparing a pixel defining layer according to another embodiment of the present disclosure.

In order to further improve the effect of forming the first defining pattern on the substrate, according to the embodiments of the present disclosure, referring to FIG. 2, before forming the first defining pattern, the method may further comprise:

S10: Subjecting the Substrate to a Modification Treatment

According to the embodiments of the present disclosure, in this step, the surface of the substrate may be subjected to a modification treatment to reduce the surface energy of the substrate before forming the first defining pattern. According to particular embodiments of the present disclosure, by subjecting the surface of the substrate for forming the first defining pattern and the second defining pattern to a modification treatment to reduce the surface energy of the substrate, it is advantageous for preventing a large deviation between the actually formed boundary of the first defining pattern and the boundary of the first defining pattern predetermined to be formed due to excessive wetting after the first material is ink jet printed onto the substrate. Also, by reducing the surface energy of the substrate, it is advantageous for obtaining the first defining pattern with a small width, and in turn obtaining a pixel defining layer with a small size. Thus, the quality of the first defining pattern formed on the substrate can be improved.

In this step, the method for subjecting the substrate to the modification treatment is not particularly limited, and can be selected by those skilled in the art according to actual situations. For example, the surface of the substrate may be subjected to a modification treatment by using a plasma surface treatment technology. According to particular embodiments of the present disclosure, the substrate may be subjected to a surface treatment using $CF_4$ plasma or a fluorinated siloxane solution, so as to reduce the surface energy of the substrate.

According to the embodiments of the present disclosure, forming the first defining pattern may be achieved by the following steps.

Figure 3:
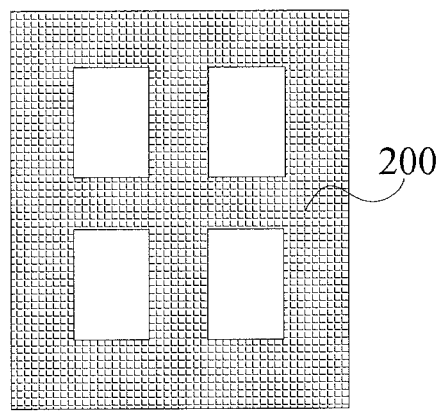
FIG. 3 shows a structural schematic diagram of a first defining pattern layer according to an embodiment of the present disclosure.
Figure 4:
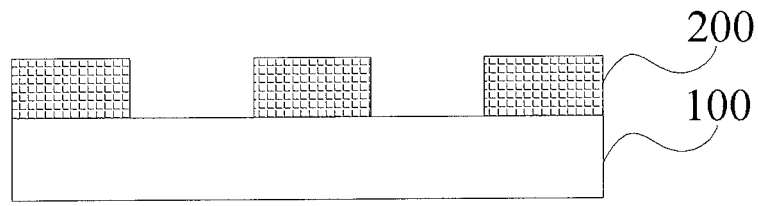
FIG. 4 shows a structural schematic diagram of a first defining pattern layer according to another embodiment of the present disclosure.

Firstly, referring to FIG. 3 and FIG. 4 (a cross-sectional view of substrate 100 and first defining pattern layer 200), a first defining pattern layer 200 is formed in a predetermined region of a substrate 100 by ink jet printing a first material. Those skilled in the art may comprehend that the first defining pattern layer formed in this step is used for defining the ink jet printing boundary in subsequent ink jet printing. Thus, in this step, a region of the substrate 100 other than the predetermined region is a region for performing subsequent ink jet printing. That is, the above predetermined region is a region of the substrate 100 corresponding to a pixel defining layer for ink jet printing.

The shape of the above predetermined region and the shape of the first defining pattern layer 200 are not particularly limited, and can be designed by those skilled in the art according to specific printing shape required for ink jet printing. For example, according to particular embodiments of the present disclosure, when the pixel defining layer is a pixel defining layer for preparing an OLED with an ink jet printing technology, the first defining pattern layer 200 for forming the first defining pattern may have a shape as shown in FIG. 3. That is, the first defining pattern may define a plurality of regularly arranged rectangle regions (pixel regions) on the substrate, and the rectangle regions can be used for forming a light emitting layer of an OLED during the preparation of the OLED. Those skilled in the art may comprehend that the number and arrangement of the rectangle regions shown in FIG. 3 are only illustrative, but not construed as limiting the present disclosure. Particular parameters such as number, arrangement and size of the above rectangle regions can be designed by those skilled in the art according to actual requirement for ink jet printing and parameters of the OLED prepared.

Figure 5:
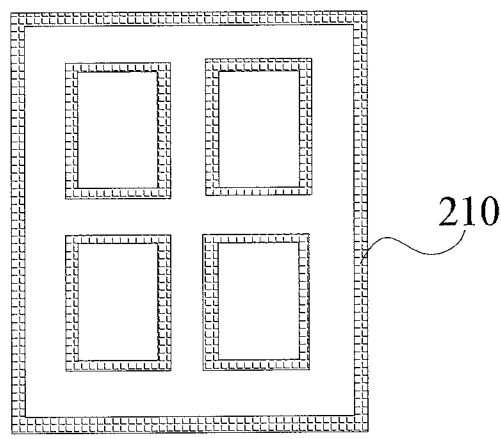
FIG. 5 shows a structural schematic diagram of a first defining pattern according to an embodiment of the present disclosure.
Figure 6:
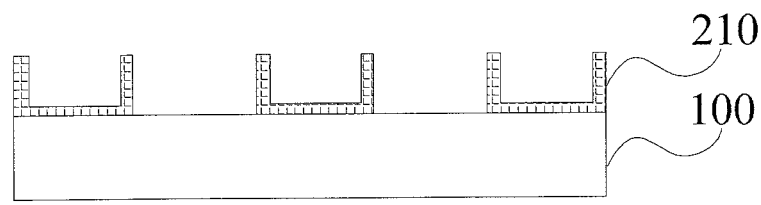
FIG. 6 shows a structural schematic diagram of a first defining pattern according to another embodiment of the present disclosure.

According to the embodiments of the present disclosure, referring to FIG. 5 and FIG. 6 (a cross-sectional view of substrate 100 and first defining pattern 210), after forming the first defining pattern layer 200, the first defining pattern layer 200 may be subjected to a drying treatment to form a concave accommodation groove. The concave accommodation groove constitutes a first defining pattern 210. Thus, the first defining pattern 210 constituted by the concave accommodation groove may be formed by simply and conveniently making use of the coffee ring effect of drying treatment, without any complex masking process.

According to the embodiments of the present disclosure, the type of the first material is not particularly limited, and as described above, the first material may have a high surface energy so as to facilitate the formation of the concave accommodation groove after the drying treatment. According to the embodiments of the present disclosure, the above first material may comprise at least one of a polyimide and an acrylic material. Due to a high surface energy of the above material, the first material does not easily wet the substrate, which is advantageous for improving the quality of the concave accommodation groove formed.

As described above, the first defining pattern 210 is constituted by the concave accommodation groove formed by making use of the coffee ring effect of drying treatment. Therefore, by controlling the conditions for the drying treatment and forming the first defining pattern, it may ensure that the concave accommodation groove with a predetermined shape can be formed in a predetermined position by the first defining pattern layer. In particular, it is required to ensure that the size of the concave accommodation groove formed from the first defining pattern layer after the drying treatment will not vary significantly as compared to the first defining pattern layer. Also, the height of the concave accommodation groove formed will not be significantly different from the thickness of the first defining pattern layer.

According to particular embodiments of the present disclosure, in view of the fact that the concave accommodation groove is formed by subjecting the first defining pattern layer to a drying treatment, and there may be an error between the size of the concave accommodation groove after the drying treatment and the size of the first defining pattern layer, the above error between the sizes of the concave accommodation groove and the first defining pattern layer can be counted into the error for ink jet printing when the first defining pattern layer is formed by ink jet printing the first solution formed from the first material, so that the finally obtained concave accommodation groove has a predetermined size. According to the embodiments of the present disclosure, the value of the error is not particularly limited. In the present disclosure, the error is mainly derived from the accuracy of the equipment, and the error can be controlled within +/−5 μm with the capability of current equipment.

After a great number of experiments, the inventors have found that the quality of the concave accommodation groove formed by making use of the coffee ring effect can be further improved by adjusting parameters such as the concentration of the first solution for ink jet printing and the type of the solvent for forming the first solution. In particular, the inventors have found that when the concentration of the first material in the first solution for ink jet printing is relatively low, and the boiling point of the first solvent used is relatively low, it is advantageous for the first defining pattern layer printed to better maintain the original size after the drying treatment, that is, the quality of the concave accommodation groove formed is better. According to particular embodiments of the present disclosure, when the concentration of the first material in the solvent used is not lower than 0.5 wt %, and the boiling point of the first solvent is not higher than 180° C., or when the concentration of the first material in the solvent used is not higher than 30 wt %, it is advantageous for forming a desirable concave accommodation groove by making use of the coffee ring effect. For example, according to particular embodiments of the present disclosure, the first solvent may be a mixed solvent. The mixed solvent may comprise a good solvent for the first material (the component capable of better dissolving the first material in the mixed solvent) and a poor solvent for the first material. In the mixed solvent, the boiling point of the good solvent for the first material is lower than 180° C., and the boiling point of the poor solvent may be not lower than 180° C. According to other embodiments of the present disclosure, the concentration of the first material in the solvent used, i.e., the concentration of the first material in the first solution may be not higher than 30 wt %.

After a great number of experiments, the inventors have found that the drying rate of the drying treatment also influences the quality of the concave accommodation groove formed. A slower drying rate is advantageous for forming a more desirable concave accommodation groove. In particular, according to the embodiments of the present disclosure, the drying treatment may be a vacuum drying treatment under reduced pressure, a normal temperature drying treatment, or a low temperature drying treatment. Here, the normal temperature drying treatment is to naturally dry the first defining pattern layer under a condition without additional heating or cooling. The low temperature drying treatment may be performed at a temperature not higher than 50° C., for example, not higher than 20° C.

According to particular embodiments of the present disclosure, the vacuum drying treatment under reduced pressure may be performed by the following steps: placing the first defining pattern layer into a vacuum drying oven, reducing the pressure in the vacuum chamber to 150 to 250 Pa over 3 to 10 minutes, and keeping the reduced pressure for 5 to 15 minutes. For example, the pressure in the chamber may be reduced to around 200 Pa over 5 minutes by evacuation, and kept for 10 minutes. Subsequently, the first defining pattern layer after the above vacuum drying treatment under reduced pressure is subjected to a baking treatment. The baking treatment may be performed at a temperature not lower than 200° C. Thus, it is advantageous for improving the quality of the concave accommodation groove formed.

According to particular embodiments of the present disclosure, the concave accommodation groove may also be formed by using a normal temperature drying treatment. In particular, the first defining pattern layer may be allowed to stand at a normal temperature for 25 to 50 minutes, so that the concave accommodation groove is formed from the first defining pattern layer by slowly drying.

According to particular embodiments of the present disclosure, the concave accommodation groove may also be formed by using a low temperature drying treatment. In particular, the first defining pattern layer may be allowed to stand at a temperature not higher than 20° C. for 40 to 60 minutes.

According to the embodiments of the present disclosure, in order to further improve the quality of the concave accommodation groove, the method may further comprise, after the above drying treatment, subjecting the concave accommodation groove to a high temperature annealing treatment. Thus, the quality of the first defining pattern (i.e., the concave accommodation groove) formed can be further improved. According to particular embodiments of the present disclosure, the temperature of the high temperature annealing treatment may be not lower than 200° C. Thus, the mechanical supporting strength and stability of the first defining pattern can be improved by further drying the first defining pattern.

According to the embodiments of the present disclosure, forming the second defining pattern may be achieved by the following steps.

Figure 7:
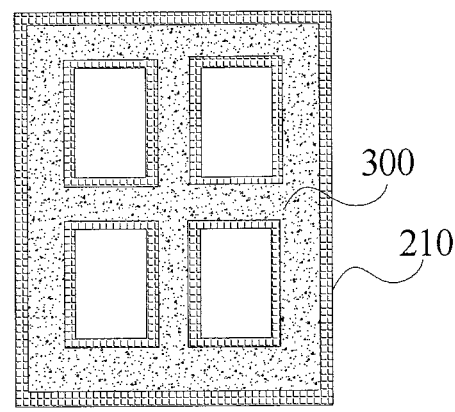
FIG. 7 shows a structural schematic diagram of a pixel defining layer according to an embodiment of the present disclosure.
Figure 8:
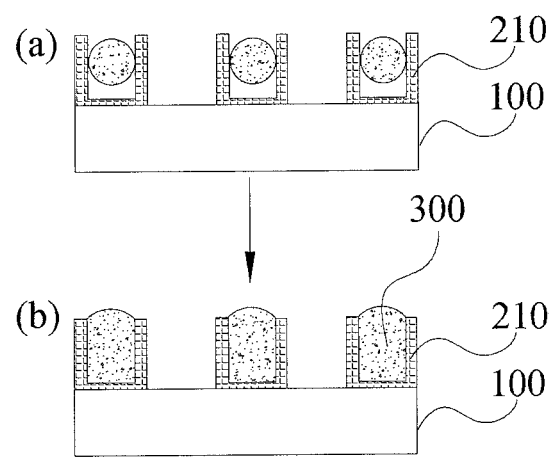
FIG. 8 shows a schematic flow chart of a process for forming a second defining pattern according to an embodiment of the present disclosure.

Referring to FIG. 7 and FIG. 8, a solution containing a second material is ink jet printed in the first defining pattern 210 (i.e., the concave accommodation groove), and subjected to a baking treatment. Thus, the second defining pattern 300 can be simply and conveniently formed in the concave accommodation groove.

According to the embodiments of the present disclosure, the second pattern for forming the second defining pattern may have a low surface energy. In particular, the second pattern has a second surface energy, and the above described first patter have a first surface energy, wherein the second surface energy may be lower than the first surface energy. Thus, it is advantageous for precisely controlling the thickness of the printed pattern formed by using the pixel defining layer.

Figure 9:
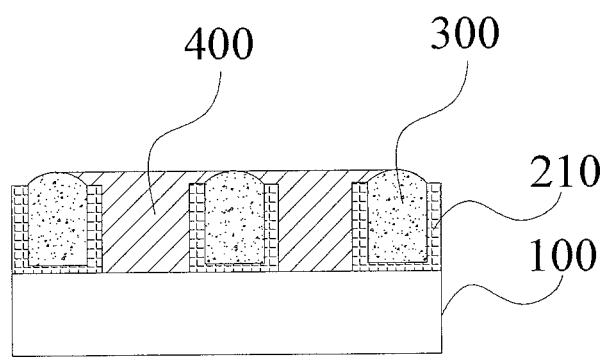
FIG. 9 shows a structural schematic diagram of an OLED according to an embodiment of the present disclosure.

According to the embodiments of the present disclosure, referring to FIG. 9, the above first defining pattern 210 (i.e., the concave accommodation groove) and the second defining pattern 300 constitute the pixel defining layer for ink jet printing according to the embodiments of the present disclosure. Here, the first defining pattern 210 defines a region for ink jet printing on the substrate 100, and the second defining pattern 300 is formed in the concave accommodation groove constituting the first defining pattern 210 to define the height of the ink jet printed pattern. According to particular embodiments of the present disclosure, when the pixel defining layer is used to form a light emitting layer of an OLED by ink jet printing in practical application, an ink for forming a light emitting layer is printed by ink jet printing in a region of the substrate 100 other than the pixel defining layer, to form a light emitting layer 400. Because the second material has a lower surface energy than the first material, the second material has a surface property more similar to that of the ink of the ink jet printing for forming the light emitting layer 400. Therefore, the second defining pattern 300 formed from the second material can be used to define the height of the light emitting layer 400, so as to prevent the material for forming the light emitting layer 400 from going beyond the region defined by the first defining pattern, resulting in a reduced yield rate. Also, because there is a difference as described above between the first material and the second material in terms of the surface energy, the second material formed in the concave accommodation groove will not wet and spread well in the concave accommodation groove, and there is a relatively small contact angle between the concave accommodation groove formed from the first material and the droplets formed from the second material printed therein, so that the second defining pattern formed from the second material can have an arc-shaped upper surface protruding from the concave accommodation groove. The height of the second defining pattern 300 can be simply and conveniently controlled by adjusting the amount of the second material ink jet printed. Thus, the light emitting layer 400 can be allowed to have a uniform height, thereby improving the effect of ink jet printing with the pixel defining layer. According to particular embodiments of the present disclosure, the second material may comprise at least one of a fluorinated polyimide, a polysiloxane and a fluorinated methyl methacrylate, and the baking treatment may be performed at a temperature not lower than 200° C. and not higher than 250° C., for example, at a temperature of 230° C. or 200° C. Thus, it is advantageous for further improving the quality of the second defining pattern formed.

Those skilled in the art may comprehend that after ink jet printing the second material, the method may further comprise a drying step so that the second material can form the second defining pattern. According to the embodiments of the present disclosure, when forming the second defining pattern, in view of a difference between the size of the dried second defining pattern and the size of the undried second material, the above difference may be counted into the error for printing when ink jet printing the second material, so as to obtain a second defining pattern with a high printing precision. Thus, the accuracy of the finally obtained pattern can be ensured, thereby improving the printing precision.

According to the embodiments of the present disclosure, the pixel defining layer obtained with the above method can have a structure as shown in FIG. 7. In particular, referring to FIG. 7, the pixel defining layer comprises a first defining pattern 210 on the substrate and a second defining pattern 300. The pixel defining layer has at least one of the following advantages. The pixel defining layer capable of precisely controlling the printing thickness can be achieved without the double masking process. Thus, the preparation process of the pixel defining layer for ink jet printing can be simplified, the production cost can be reduced, and the accuracy for alignment can be improved.

In another aspect of the present disclosure, the present disclosure provides a method for preparing an OLED. According to the embodiments of the present disclosure, the method comprises the following steps.

Preparing a Pixel Defining Layer

According to the embodiments of the present disclosure, in this step, the pixel defining layer is prepared by the above-described method. Thus, the pixel defining layer capable of precisely controlling the position of the light emitting layer can be obtained with a relatively simple operation.

Forming an Organic Light Emitting Layer

According to the embodiments of the present disclosure, in this step, the organic light emitting layer (sometimes referred to as organic layer or light emitting layer) is formed in the pixel defining layer as prepared above, by means of a process including, but not limited to ink jet printing and the like. Thus, an OLED can be obtained. As described above, because the pixel defining layer prepared above can define the position of the organic layer well, in an OLED prepared with the method, the position of the organic layer can be precisely controlled, which is advantageous for improving the performance of the OLED.

In yet another aspect of the present disclosure, the present disclosure provides an OLED. According to the embodiments of the present disclosure, the OLED comprises a pixel defining layer and a light emitting layer. The pixel defining layer is the above described pixel defining layer, and the light emitting layer is formed by ink jet printing based on the pixel defining layer. Those skilled in the art may comprehend that the OLED comprises the above described pixel defining layer, and it thus has all of the features and advantages which the above described pixel defining layer has, which will not be reiterated here. The light emitting layer is formed by ink jet printing based on the pixel defining layer. As described above, a uniform thickness can be obtained by using the light emitting layer formed with the above pixel defining layer. Therefore, the OLED has a high yield rate and usability. In summary, the OLED has at least one of the following advantages: no complex masking process is required for preparing the pixel defining layer, thereby reducing the production cost and improving the production efficiency; the light emitting layer has a uniform thickness, and the OLED has a good performance.

Each component of the OLED will be described in detail below according to particular embodiments of the present disclosure.

According to the embodiments of the present disclosure, the pixel defining layer comprises a first defining pattern and a second defining pattern, the first defining pattern is composed of a concave accommodation groove formed from a first material, and the second defining pattern is formed from a second material in the concave accommodation groove. The first defining pattern has a first surface energy, and the second defining pattern has a second surface energy, wherein the first surface energy is higher than the second surface energy. Thus, the quality of the light emitting layer formed by ink jet printing can be improved.

According to the embodiments of the present disclosure, the first material may comprise at least one of a polyimide, and an acrylic material; and the second material may comprise at least one of a fluorinated polyimide, a polysiloxane and a fluorinated methyl methacrylate. In order to further decrease the size of the pixel defining layer prepared and to obtain a pixel defining material with a smaller width (that is, the width of the concave accommodation groove is controlled to be smaller), the substrate may be allowed to have a third surface energy, and the third surface energy is less than the first surface energy and is less than the second surface energy. Thus, the width of the concave accommodation groove can be controlled to be 20 μm or less.

According to the embodiments of the present disclosure, the shape of the second defining pattern is not particularly limited. The top of the second defining pattern may be as high as the concave accommodation groove, that is, the concave accommodation groove is filled with the second defining pattern. Or the second defining pattern may be a protrusion formed in the concave accommodation groove.

Thus, it is advantageous for further improving the defining effect of the pixel defining layer on the light emitting layer by means of the second defining pattern. A difference in height between a top of the second defining pattern and the concave accommodation groove may be not less than 0.5 µm. According to the embodiments of the present disclosure, a width of the second defining pattern in a direction parallel to the substrate is not more than that of the first defining pattern. Thus, it is advantageous for improving the precision for defining the position of the light emitting layer.

According to the embodiments of the present disclosure, an upper surface of the second defining pattern is arc-shaped, hemispheric, trapezoidal, or parabolic. The shape of the second pixel defining layer is associated with the width of the concave accommodation groove and the difference in surface energy between the first material and the second material, and can be adjusted by those skilled in the art according to particular conditions.

According to particular embodiments of the present disclosure, the pixel defining layer may have a total height of 1 to 3 µm, and a width of 15 to 100 µm. That is, the height from the top of the second defining pattern to the substrate may be 1 to 3 µm. According to the embodiments of the present disclosure, the concave accommodation groove may have a height of 1 to 3 µm, and a width of 15 to 100 µm. Thus, it is advantageous for obtaining a light emitting layer with a small size and a high precision, thereby improving the performance of the OLED.

In another aspect of the present disclosure, the present disclosure provides a display device. According to the embodiments of the present disclosure, the display device comprises the above described OLED. Thus, the display device has all of the features and advantages which the above described OLED has, which will not be reiterated here. In summary, the display device has at least one of the following advantages: low production cost, high production efficiency, uniform thickness of the light emitting layer, and good display performance.

In the description of the present disclosure, a direction or position relationship indicated by the term "above", "below" or the like is described on the basis of the direction or position relationship shown in figure(s), and it is only for the purpose of describing the present disclosure conveniently, but it does not require the present disclosure to be constructed or operated in a particular direction or position. As a result, it should not be interpreted as limiting the present disclosure.

In the description of the present disclosure, the description with reference to term "an embodiment", "another embodiments", or the like means that the particular feature, structure, material or characteristic described with reference to the embodiment is included in at least one embodiment of the present disclosure. In this specification, the exemplary expressions of the above terms are not required to refer to the same embodiment or example. And the particular feature, structure, material or characteristic described can be combined in a suitable manner in one or more embodiments or examples. Further, without contradicting with each other, different embodiments or examples as well as the features of different embodiments or examples described in this specification can be combined by those skilled in the art. Furthermore, it should be noted that the term "first" or "second" is only used for description purpose, but cannot be understood to indicate or suggest the relative importance or to imply the amount of the indicated technical feature.

Although the embodiments of the present disclosure have been shown and described above, it should be understood that the above embodiments are exemplary, and should not be construed as limiting the present disclosure. A person of ordinary skills in the art can make change, modification, replacement and variation on the above embodiments within the scope of the present disclosure.

What is claimed is:

1. A method for preparing a pixel defining layer, comprising:
    providing a substrate;
    forming a first defining pattern on the substrate, said forming the first defining pattern comprising ink jet printing a first material on the substrate, and then forming a concave accommodation groove, the concave accommodation groove constituting the first defining pattern;
    forming a second defining pattern by ink jet printing a second material in the concave accommodation groove,
    wherein the first defining pattern and the second defining pattern constitute the pixel defining layer.

2. The method according to claim 1, wherein the concave accommodation groove is formed by ink jet printing the first material to form the first defining pattern layer in a predetermined region of the substrate, and then subjecting the first defining pattern layer to a drying treatment.

3. The method according to claim 2, wherein the drying treatment includes a vacuum drying treatment under reduced pressure, a normal temperature drying treatment, or a low temperature drying treatment.

4. The method according to claim 3, wherein,
    the vacuum drying treatment under reduced pressure comprises: subjecting the first defining pattern layer to a vacuum drying treatment under reduced pressure by reducing the pressure of a cavity for performing the vacuum drying treatment under reduced pressure to 150 to 250 Pa over 3 to 10 minutes, keeping the reduced pressure for 5 to 15 minutes, and subjecting the first defining pattern layer after vacuum drying treatment under reduced pressure to a baking treatment at a temperature not lower than 200° C.;
    the normal temperature drying treatment comprises: allowing the first defining pattern layer stand at a normal temperature for 25 to 50 minutes; and
    the low temperature drying treatment comprises: allowing the first defining pattern layer stand at a temperature not higher than 20° C. for 40 to 60 minutes.

5. The method according to claim 1, wherein the first defining pattern has a first surface energy, and the second defining pattern has a second surface energy, and wherein the first surface energy is higher than the second surface energy.

6. The method according to claim 1, wherein, before forming the first defining pattern, the method further comprises:
    subjecting a surface of the substrate for forming the first defining pattern and the second defining pattern to a modification treatment to reduce the surface energy of the substrate.

7. The method according to claim 1, wherein the first material comprises at least one of a polyimide and an acrylic material.

8. The method according to claim 1, wherein said ink jet printing the first material comprises:
    dissolving the first material in a first solvent to prepare a first solution and ink jet printing the first solution, wherein the first material has a concentration of 0.5 wt % to 30 wt % in the first solvent; and the first solvent has a boiling point not higher than 180° C.

9. The method according to claim 1, wherein the second defining pattern is formed by dissolving the second material in a second solvent to prepare a second solution, ink jet printing the second solution containing the second material in the concave accommodation groove, and performing a baking treatment.

10. The method according to claim 9, wherein the second material comprises at least one of a fluorinated polyimide, a polysiloxane and a fluorinated methyl methacrylate, and the baking treatment is performed at a temperature not lower than 200° C. and not higher than 250° C.

11. A method for preparing an organic light emitting device (OLED), comprising:

a step of preparing a pixel defining layer, and a step of forming an organic light emitting layer in the pixel defining layer, wherein said step of preparing the pixel defining layer is performed by using the method of claim 1.

12. A pixel defining element, comprising:

a substrate, and a first defining pattern and a second defining pattern formed on the substrate, wherein the first defining pattern is composed of a concave accommodation groove formed from a first material, and the second defining pattern is formed from a second material in the concave accommodation groove.

13. The pixel defining element according to claim 12, wherein the first defining pattern has a first surface energy, and the second defining pattern has a second surface energy, wherein the first surface energy is higher than the second surface energy.

14. The pixel defining element according to claim 12, wherein the first material comprises at least one of a polyimide and an acrylic material; and the second material comprises at least one of a fluorinated polyimide, a polysiloxane and a fluorinated methyl methacrylate.

15. The pixel defining element according to claim 13, wherein the substrate has a third surface energy, wherein the third surface energy is less than the second surface energy.

16. The pixel defining element according to claim 12, wherein the second defining pattern is a protrusion formed in the concave accommodation groove, wherein a difference in height between a top of the second defining pattern and the concave accommodation groove is not less than 0.5 μm.

17. The pixel defining element according to claim 16, wherein an upper surface of the second defining pattern is arc-shaped, hemispheric, trapezoidal, or parabolic.

18. The pixel defining element according to claim 12, wherein the pixel defining layer has a height of 1 to 3 μm, and a width of 15 to 100 μm, and wherein the concave accommodation groove has a height of 1 to 3 μm, and a width of 15 to 100 μm.

19. An OLED comprising:

the pixel defining element according to claim 12, and an organic light emitting layer formed in a pixel region defined by the pixel defining layer.

20. A display device comprising the OLED according to claim 19.

* * * * *